(12) United States Patent
Lim et al.

(10) Patent No.: US 11,428,743 B2
(45) Date of Patent: Aug. 30, 2022

(54) METHOD AND APPARATUS FOR CHARGING BATTERY

(71) Applicant: SAMSUNG ELECTRONICS CO., LTD., Suwon-si (KR)

(72) Inventors: Ju Wan Lim, Suwon-si (KR); Duk Jin Oh, Seoul (KR); Daeryong Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 782 days.

(21) Appl. No.: 16/372,742

(22) Filed: Apr. 2, 2019

(65) Prior Publication Data

US 2020/0124679 A1    Apr. 23, 2020

(30) Foreign Application Priority Data

Oct. 19, 2018   (KR) .................... 10-2018-0124945

(51) Int. Cl.
  *H02J 7/00*   (2006.01)
  *G01R 31/3842*   (2019.01)
  *H01M 10/44*   (2006.01)

(52) U.S. Cl.
  CPC ...... *G01R 31/3842* (2019.01); *H01M 10/441* (2013.01); *H02J 7/007* (2013.01); *H01M 2220/20* (2013.01)

(58) Field of Classification Search
  CPC .... H02J 7/0048; H02J 7/007; G01R 31/3842; H01M 10/441; H01M 2220/20
  USPC ....................................................... 320/132
  See application file for complete search history.

(56) References Cited

U.S. PATENT DOCUMENTS

| | | | |
|---|---|---|---|
| 6,107,782 A * | 8/2000 | Imai | H01M 10/44 320/160 |
| 8,054,038 B2 | 11/2011 | Kelty et al. | |
| 8,117,857 B2 | 2/2012 | Kelty et al. | |
| 8,508,191 B2 | 8/2013 | Kim et al. | |
| 8,618,775 B2 | 12/2013 | Hermann et al. | |
| 8,624,560 B2 | 1/2014 | Ungar et al. | |
| 8,961,203 B2 | 2/2015 | Lee | |
| 8,972,213 B2 | 3/2015 | Zhang et al. | |
| 2011/0031938 A1* | 2/2011 | Ishikawa | G01R 31/367 180/65.29 |
| 2013/0119921 A1 | 5/2013 | Choe et al. | |

(Continued)

FOREIGN PATENT DOCUMENTS

| | | | |
|---|---|---|---|
| CN | 105807226 B | 7/2018 | |
| CN | 110673039 A * | 1/2020 | ........... G01R 31/378 |

(Continued)

OTHER PUBLICATIONS

Extended European Search Report dated Dec. 18, 2019 in corresponding European Application No. 19181186.8 (8 pages in English).

*Primary Examiner* — Richard Isla
*Assistant Examiner* — Mohammed J Sharief
(74) *Attorney, Agent, or Firm* — NSIP Law

(57) ABSTRACT

A battery charging method includes: charging a battery based on a charging profile; and in response to a charging termination event occurring, terminating the charging of the battery, wherein the charging profile is determined using weight information derived based on battery characteristic information and a basic charging profile.

18 Claims, 16 Drawing Sheets

100

(56) References Cited

U.S. PATENT DOCUMENTS

| | | | |
|---|---|---|---|
| 2015/0188327 A1* | 7/2015 | Ogihara | H02J 7/008 |
| | | | 320/137 |
| 2016/0087461 A1 | 3/2016 | Greening et al. | |
| 2017/0126023 A1* | 5/2017 | Jung | H02J 7/0077 |
| 2017/0279165 A1* | 9/2017 | Tanii | H02J 7/0031 |
| 2017/0034361 A1 | 11/2017 | Ho | |
| 2017/0338666 A1 | 11/2017 | Christensen et al. | |
| 2018/0013179 A1 | 1/2018 | Nomura et al. | |
| 2018/0059498 A1* | 3/2018 | Coffin | G02F 1/163 |
| 2018/0097396 A1 | 4/2018 | Qi et al. | |
| 2020/0103468 A1* | 4/2020 | Watanabe | G01R 31/374 |
| 2021/0104782 A1* | 4/2021 | Park | H01M 10/441 |
| 2021/0281102 A1* | 9/2021 | Li | H02J 7/00308 |

FOREIGN PATENT DOCUMENTS

| | | | |
|---|---|---|---|
| EP | 2990818 A2 * | 3/2016 | G01R 31/3648 |
| EP | 3492939 A1 * | 6/2019 | G01R 31/025 |
| JP | WO 2014/118824 A1 | 8/2014 | |
| JP | WO 2014/167602 A1 | 10/2014 | |
| JP | 2017-97997 A | 6/2017 | |
| KR | 10-1651829 B1 | 8/2016 | |
| KR | 10-2017-0051031 A | 5/2017 | |
| KR | 10-2017-0082258 A | 7/2017 | |
| KR | 10-2017-0103230 A | 9/2017 | |
| KR | 10-2017-0139976 A | 12/2017 | |
| KR | 10-2018-0066292 A | 6/2018 | |

* cited by examiner

METHOD AND APPARATUS FOR CHARGING BATTERY

This application claims the benefit under 35 USC § 119(a) of Korean Patent Application No. 10-2018-0124945 filed on Oct. 19, 2018, in the Korean Intellectual Property Office, the entire disclosure of which is incorporated herein by reference for all purposes.

BACKGROUND

1. Field

The following description relates to a method and apparatus to charge a battery.

2. Description of Related Art

Various battery charging methods exist. For example, a constant current-constant voltage (CCCV) based charging method may charge a battery with a constant current until a certain voltage is reached, and charge the battery with a constant voltage until a preset low current is reached. For another example, a varying current decay (VCD) based charging method may charge a battery with a high current in a low state of charge (SOC), and charge the battery by gradually reducing the current when the SOC of the battery reaches a certain SOC.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery charging method includes: charging a battery based on a charging profile; and in response to a charging termination event occurring, terminating the charging of the battery, wherein the charging profile is determined using weight information derived based on battery characteristic information and a basic charging profile.

The battery characteristic information may include a value associated with an ion diffusivity in a reference battery based on a state of charge (SOC) of the reference battery.

The battery characteristic information may be determined using a ratio between a change in quantity of electric charge of the reference battery and a change in voltage of the reference battery. The change in the quantity of electric charge of the reference battery and the change in the voltage of the reference battery may be based on a state of charge (SOC) of the reference battery.

The battery characteristic information may correspond to dQ/dV based on a state of charge (SOC) of the reference battery, wherein dQ is a change in quantity of electric charge and dV is a change in voltage of the reference battery.

The weight information may be derived using dQ/dV values in an SOC interval of the dQ/dV, and a modulation rate.

The battery characteristic information may be determined using a ratio between a difference in an open-circuit voltage (OCV), based on a state of charge (SOC) of the reference battery, and an overpotential of the reference battery.

The battery characteristic information may correspond to $(dES/dET)^2$ based on a state of charge (SOC) of the reference battery, wherein dET is a change in voltage while a current is being applied, and dES is a difference between an open-circuit voltage (OCV) before the current is applied and an OCV after the current is applied.

The weight information may be derived using $(dES/dET)^2$ values in an SOC interval of the $(dES/dET)^2$, and a modulation rate.

The weight information may be derived using characteristic values in a state of charge (SOC) interval of the battery characteristic information.

The charging profile may be modulated from the basic charging profile based on the weight information.

The terminating of the charging of the battery may include terminating the charging of the battery, in response to a voltage of the battery reaching a threshold voltage.

The terminating of the charging of the battery may include charging the battery with a constant voltage, in response to a voltage of the battery reaching a threshold voltage, and terminating the charging of the battery, in response to a current of the battery reaching a termination current while the battery is being charged with the constant voltage.

In another general aspect, a non-transitory, computer-readable storage medium stores instructions that, when executed by a processor, cause the processor to perform the method described above.

In another general aspect, a battery charging method includes: determining battery characteristic information of a battery based on input information; deriving weight information based on the determined battery characteristic information; and determining a charging profile based on the derived weight information and a basic charging profile, wherein the determined charging profile is configured to be implemented to charge the battery.

The battery characteristic information may include a value associated with an ion diffusivity in the battery based on a state of charge (SOC) of the battery.

The determining of the battery characteristic information may include determining the battery characteristic information using a ratio between a change in quantity of electric charge of the battery and a change in voltage of the battery. The change in the quantity of electric charge of the battery and the change in the voltage of the battery may be based on a state of charge (SOC) of the battery.

The determining of the battery characteristic information may include determining state of charge-based (SOC-based) dQ/dV to be the battery characteristic information, wherein dQ is a change in quantity of electric charge and dV is a change in voltage.

The deriving of the weight information may include deriving the weight information based on dQ/dV values in an SOC interval of the SOC-based dQ/dV, and a modulation rate.

The determining of the battery characteristic information may include determining the battery characteristic information using a ratio between a difference in an open-circuit voltage (OCV), based on a state of charge (SOC) of the battery, and an overpotential.

The determining of the battery characteristic information may include determining state of charge-based (SOC-based) $(dES/dET)^2$ to be the battery characteristic information, wherein dET is a change in voltage while a current is being applied, and dES is a difference between an open-circuit voltage (OCV) before the current is applied and an OCV after the current is applied.

The deriving of the weight information may include deriving the weight information using $(dES/dET)^2$ values in an SOC interval of the SOC-based $(dES/dET)^2$, and a modulation rate.

The deriving of the weight information may include deriving the weight information using characteristic values in a state of charge (SOC) interval of the battery characteristic information.

The battery charging method may further include: deriving different weight information by adjusting a modulation rate.

The determining of the charging profile may include modulating the basic charging profile based on the derived weight information.

The battery charging method may further include: charging the battery based on the determined charging profile.

In another general aspect, a battery charging apparatus includes: a memory configured to store a charging profile; and a charger configured to charge a battery based on the charging profile, and terminate the charging of the battery in response to a charging termination event occurring, wherein the charging profile is determined using weight information derived based on battery characteristic information and a basic charging profile.

The basic charging profile may be a charging profile in which a charging current changes stepwise based on a state of charge (SOC) of the reference battery.

The basic charging profile may be a constant current-constant voltage (CCCV) based charging profile.

The charging profile may be determined by applying the weight information to the basic charging profile.

The weight information may include weight information for each of modulation rates. The charging profile may be determined by multiplying the basic charging profile and the weight information for each of the modulation rates.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
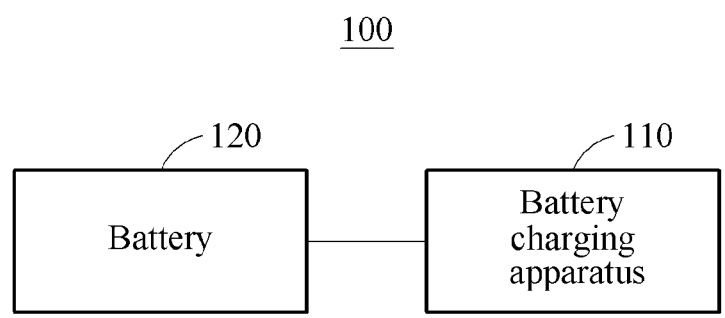
FIGS. 1 through 3 are diagrams illustrating an example of a battery charging system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," or "adjacent to" another element, it may be directly "on," "connected to," "coupled to," or "adjacent to" the other element, or there may be one or more other elements intervening therebetween. When an element is described as being "between" other elements, it may be directly "between" the other elements, or there may be one or more additional elements intervening therebetween. In contrast, when an element is described as being "directly on," "directly connected to," or "directly coupled to" another element, or as being "directly between" other elements, there can be no additional elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

It is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
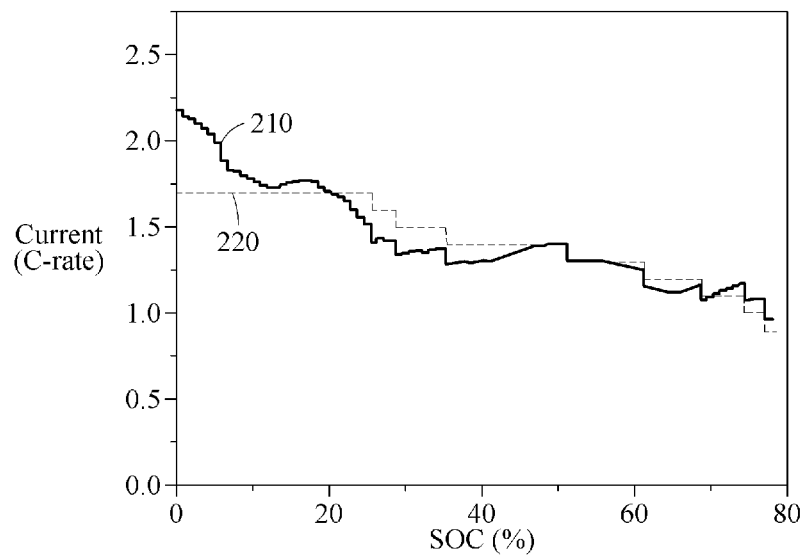
Figure 3:
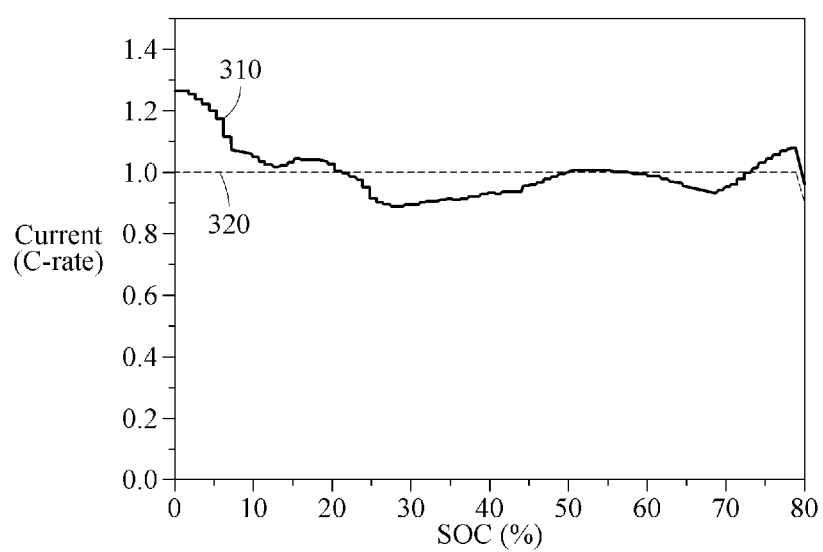

FIGS. 1 through 3 are diagrams illustrating an example of a battery charging system 100.

Referring to FIG. 1, the battery charging system 100 may include a battery charging apparatus 110 and a battery 120.

The battery 120 may be a battery cell, a battery module, or a battery pack.

The battery charging apparatus 110 may charge the battery 120 based on a charging profile. The charging profile may be determined based on a basic charging profile and weight information. An example of the charging profile is illustrated in FIG. 2. Referring to FIG. 2, a charging profile 210 is determined by applying weight information to a multistep basic charging profile 220. The multistep basic charging profile 220 may be a basic charging profile in which a charging current changes stepwise. Another example of the charging profile is illustrated in FIG. 3. Referring to FIG. 3, a charging profile 310 is determined by applying weight information to a constant current-constant voltage (CCCV) based basic charging profile 320. A manner by which the charging profile is determined will be described later in detail with reference to FIGS. 4 through 13.

The battery charging apparatus 110 may terminate the charging of the battery 120 when a charging termination event occurs while the battery 120 is being charged based on the charging profile. For example, the battery charging apparatus 110 may terminate the charging of the battery 120, in response to a voltage of the battery 120 reaching a threshold voltage. The threshold value may be, for example, 4 volts (V) to 4.2V. For another example the battery charging apparatus 110 may charge the battery 120 with a constant voltage, in response to a voltage of the battery 120 reaching the threshold voltage. In this example, when a current of the battery 120 reaches a termination current, for example, 0.05 current rates (C-rate) while the battery 120 is being charged with the constant voltage, the battery charging apparatus 110 may terminate the charging of the battery 120.

In an example, the battery charging apparatus 110 may charge the battery 120 based on the charging profile, and thus reduce a charging time used for the charging and improve a life characteristic, for example, a lifespan, of the battery 120.

Figure 4:
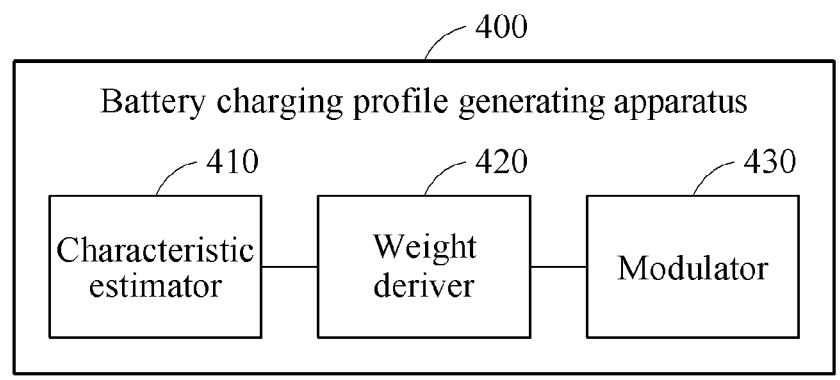
FIG. 4 is a diagram illustrating an example of a battery charging profile generating apparatus.

FIG. 4 is a diagram illustrating an example of a battery charging profile generating apparatus 400.

Referring to FIG. 4, the battery charging profile generating apparatus 400 may include a characteristic estimator 410, a weight deriver 420, and a modulator 430.

The characteristic estimator 410 determines or estimates battery characteristic information based on input information. The battery characteristic information may be, for example, information associated with characteristics of materials in a battery cell based on a state of charge (SOC). In describing that the information associated with the characteristics of materials in the battery cell are "based on a state of charge (SOC)," it is meant that such information is determined in correspondence with various SOCs of the battery. The battery cell may be the battery 120 of FIG. 1, or a reference battery of a same type as that of the battery 120. For example, the battery characteristic information may include a characteristic value of an ion, for example, a lithium ion, in the battery cell for each SOC. The characteristic value may be a value associated with an ion diffusivity in the battery cell, and may include, for example, either one or both of dQ/dV and $(dE_S/dE_T)^2$. The characteristic estimator 410 will be described further with reference to FIGS. 5 through 8B.

The weight deriver 420 derives weight information based on the determined battery characteristic information. For example, the weight deriver 420 may derive the weight information using some characteristic values of the battery characteristic information and a modulation rate. The weight deriver 420 will be described further with reference to FIGS. 9 through 10B.

The modulator 430 determines a charging profile based on the derived weight information and a basic charging profile. For example, the modulator 430 may determine the charging profile by applying the weight information to the basic charging profile. That is, the modulator 430 may determine the charging profile by modulating the basic charging profile based on the weight information. The modulator 430 will be described further with reference to FIGS. 11 through 13.

FIGS. 5 through 8B are diagrams illustrating an example of a characteristic estimator 410 of the battery charging profile generating apparatus 400.

Figure 5:
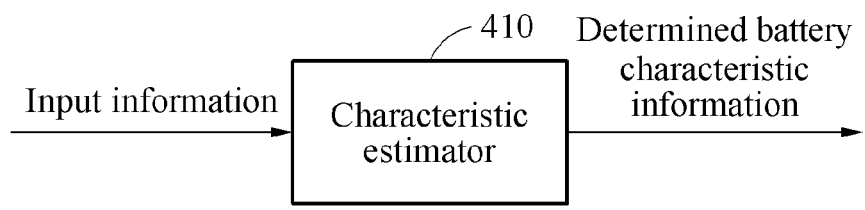
FIGS. 5 through 8B are diagrams illustrating an example of a characteristic estimator of a battery charging profile generating apparatus.

Referring to FIG. 5, the characteristic estimator 410 determines or estimates battery characteristic information based on input information. The input information may be, for example, charging information or discharging information of a battery cell, or electrochemical measurement information of the battery cell.

Figure 6A:
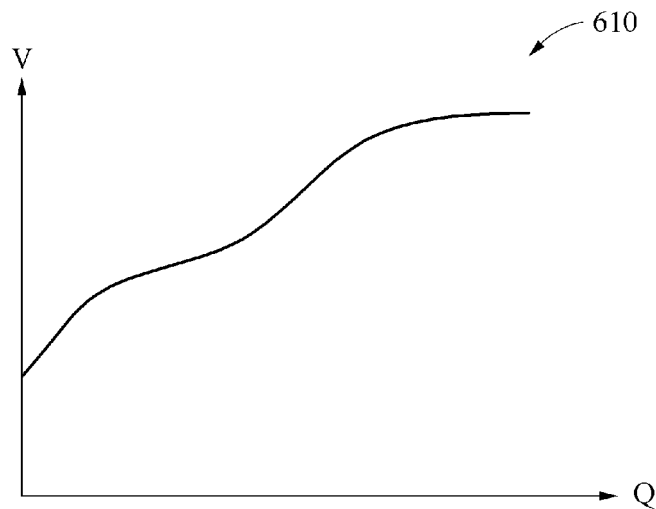

In an example, the characteristic estimator 410 may determine or estimate the battery characteristic information based on the charging information or the discharging information of the battery cell. For example, as illustrated in FIG. 6A, the characteristic estimator 410 derives relationship information 610 associated with a relationship between a quantity Q of electric charge of the battery cell and a voltage V of the battery cell, based on the charging information or the discharging information of the battery cell, determine a ratio between a change dQ in the quantity Q of electric charge based on an SOC and a change dV in the voltage V based on an SOC using the derived relationship information 610, and determine the battery characteristic information using the determined ratio. For example, the characteristic estimator 410 may determine such SOC-based dQ/dV information or an absolute value of the dQ/dV information to be the battery characteristic information. This battery characteristic information may also be referred to as dQ/dV based battery characteristic information.

Figure 6B:
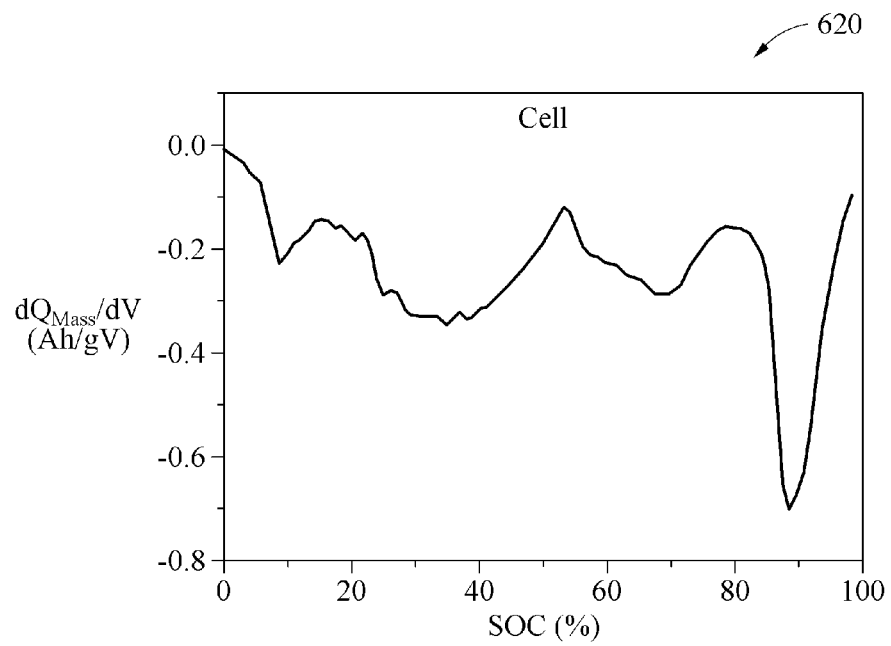

FIG. 6B illustrates dQ/dV information 620 corresponding to battery characteristic information. Table 1 indicates characteristic values of the dQ/dV information 620 based on an SOC.

TABLE 1

| SOC (%) | Characteristic Values |
|---|---|
| ... | ... |
| k | $dQ_k/dV_k$ |
| k + 1 | $dQ_{k+1}/dV_{k+1}$ |
| ... | ... |
| N | $dQ_N/dV_N$ |

A characteristic value dQ/dV for each SOC may be associated with an ion diffusivity in the entire battery cell for each SOC, which will be described hereinafter with reference to FIGS. 7A and 7B.

Figure 7A:
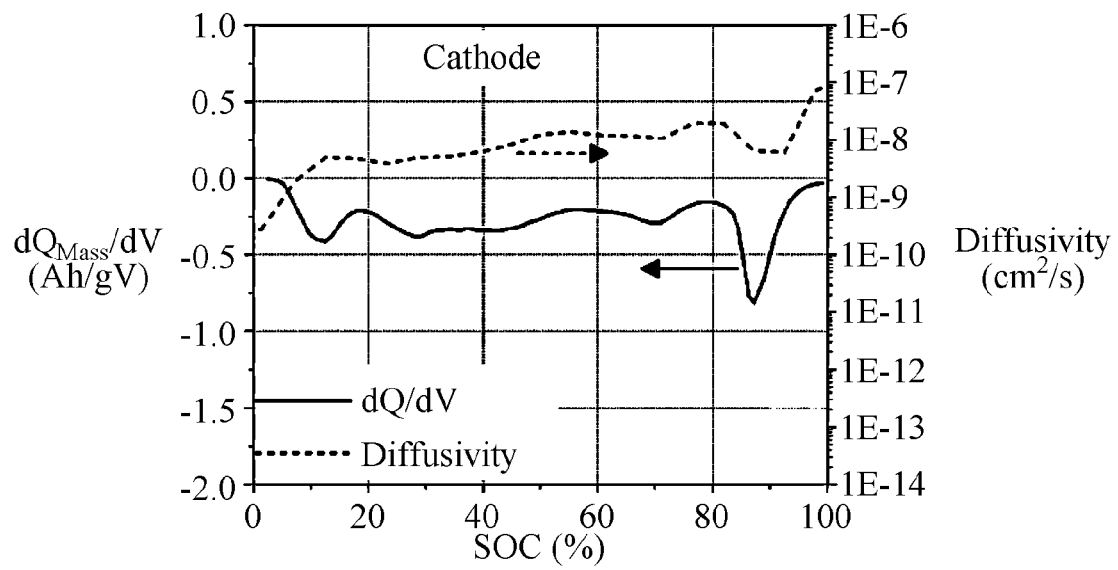
Figure 7B:
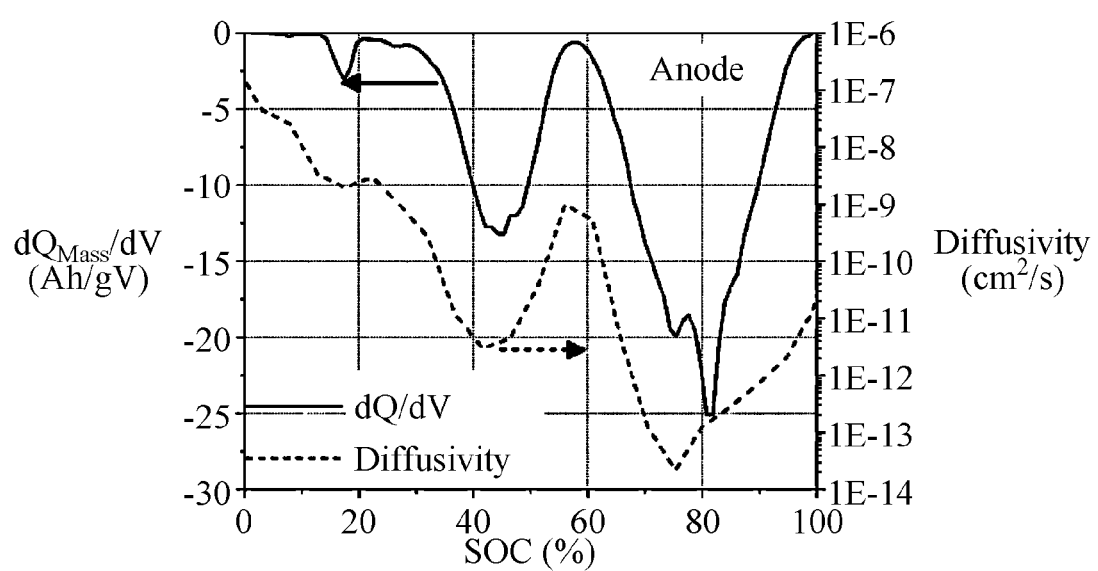

Referring to FIGS. 7A and 7B, an ion diffusivity of each electrode of the battery cell based on an SOC may be inversely changed as compared to an absolute value of dQ/dV of each electrode for each SOC. For example, when an absolute value of dQ/dV is large at an SOC, an ion diffusion coefficient may be small in the SOC. In this example, V is a voltage of the battery cell and Q is a quantity of electric charge or a capacity of the battery cell.

When applying, to the entire battery cell, such a tendency that the diffusivity in each electrode changes in a reverse direction to the change in absolute value of dQ/dV of each electrode, the change in the ion diffusivity in the entire battery cell may be estimated to be opposite to the change in absolute value of dQ/dV of the battery cell. That is, when applying, to the entire battery cell, a relationship between the diffusivity of each electrode for each SOC and the dQ/dV of each electrode for each SOC, the ion diffusivity in the entire battery cell for each SOC may be associated with the dQ/dV of the battery cell for each SOC.

In another example, the characteristic estimator 410 may determine or estimate the battery characteristic information based on the electrochemical measurement information of the battery cell for each SOC. The electrochemical information may include, for example, galvanostatic intermittent titration technique (GITT) measurement information, but is not limited thereto. The GITT measurement information for each SOC may include $dE_S$ and $dE_T$ of the battery cell for each SOC. For example, FIG. 8A illustrates GITT measurement information 810 of a battery cell at an SOC of k.

Figure 8A:
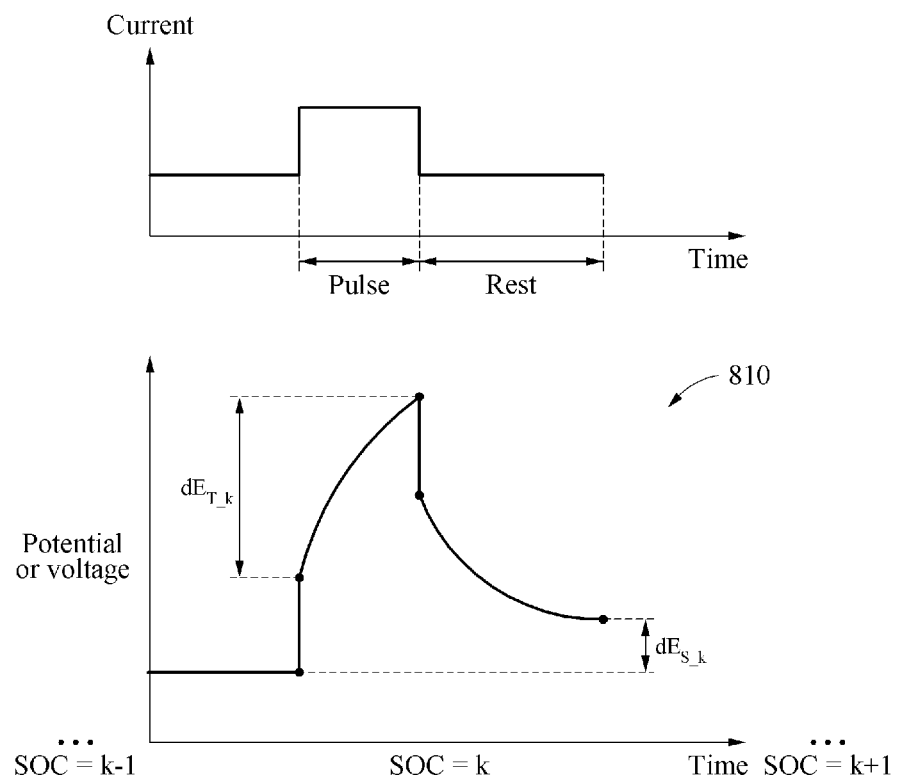

As illustrated in FIG. 8A, the GITT measurement information 810 includes $dE_{S\_k}$ and $dE_{T\_k}$, in which $dE_{S\_k}$ is a difference between an open-circuit voltage (OCV) before a current pulse is applied and an OCV after the current pulse is applied, and $dE_{T\_k}$ is a change in voltage while the current pulse is being applied. That is, $dE_{S\_k}$ is a difference in OCV, or $\Delta$OCV, and $dE_{T\_k}$ is an overpotential. The characteristic estimator 410 may determine a characteristic value at an SOC of k based on a ratio between $dE_{S\_k}$ and $dE_{T\_k}$. For example, the characteristic estimator 410 may determine $(dE_{S\_k}/dE_{T\_k})^2$ to be the characteristic value at the SOC of k. The battery cell may be charged until an SOC of the battery cell becomes k+1, and the characteristic estimator 410 may determine $(dE_{S\_k+1}/dE_{T\_k+1})^2$ to be a characteristic value at the SOC of k+1. Through the foregoing method, the characteristic estimator 410 may determine the battery characteristic information including a characteristic value, $(dE_S/dE_T)^2$, at each SOC. Such battery characteristic information may also be represented as $(dE_S/dE_T)^2$ based battery characteristic information.

Figure 8B:
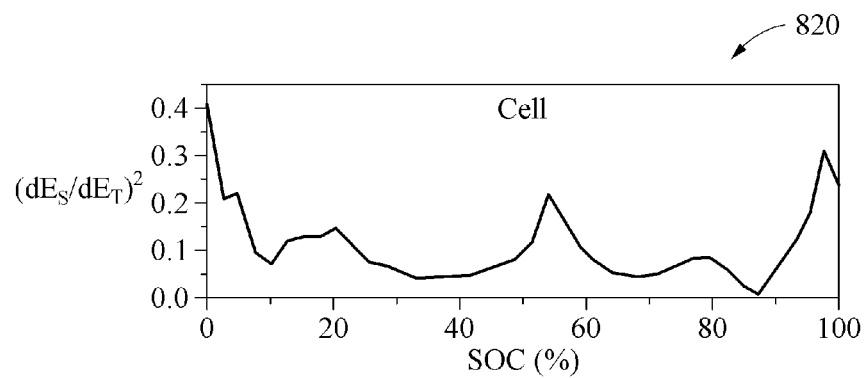

FIG. 8B illustrates $(dE_S/dE_T)^2$ information 820, which is another example of the battery characteristic information. Table 2 indicates characteristic values of the $(dE_S/dE_T)^2$ information 820 based on an SOC.

TABLE 2

| SOC (%) | Characteristic Values |
|---|---|
| ... | ... |
| k | $(dE_{S\_k}/dE_{T\_k})^2$ |
| k + 1 | $(dE_{S\_k+1}/dE_{T\_k+1})^2$ |
| ... | ... |
| N | $(dE_{S\_N}/dE_{T\_N})^2$ |

A characteristic value $(dE_S/dE_T)^2$ at each SOC may be associated with an ion diffusivity in the entire battery cell for each SOC. For example, an ion diffusion coefficient in an active material of each electrode of the battery cell may be calculated based on $$D_{Li^+} = \frac{4}{\pi T}\left(\frac{m_B V_M}{M_B A}\right)^2 \times \left(\frac{\Delta E_S}{\Delta E_T}\right)^2,$$

in which $m_B$ is an oxide mass, $V_M$ is a volume per mole, $M_B$ is a molecular weight, A is an electrode area, and T is a current pulse application time. Based on the equation above, the ion diffusivity in the entire battery cell may be estimated to be associated with $(dE_S/dE_T)^2$.

Figure 9:
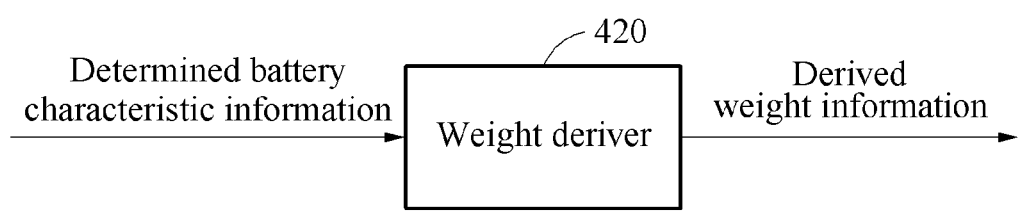
FIGS. 9 through 10B are diagrams illustrating an example of a weight deriver of a battery charging profile generating apparatus.
Figure 10A:
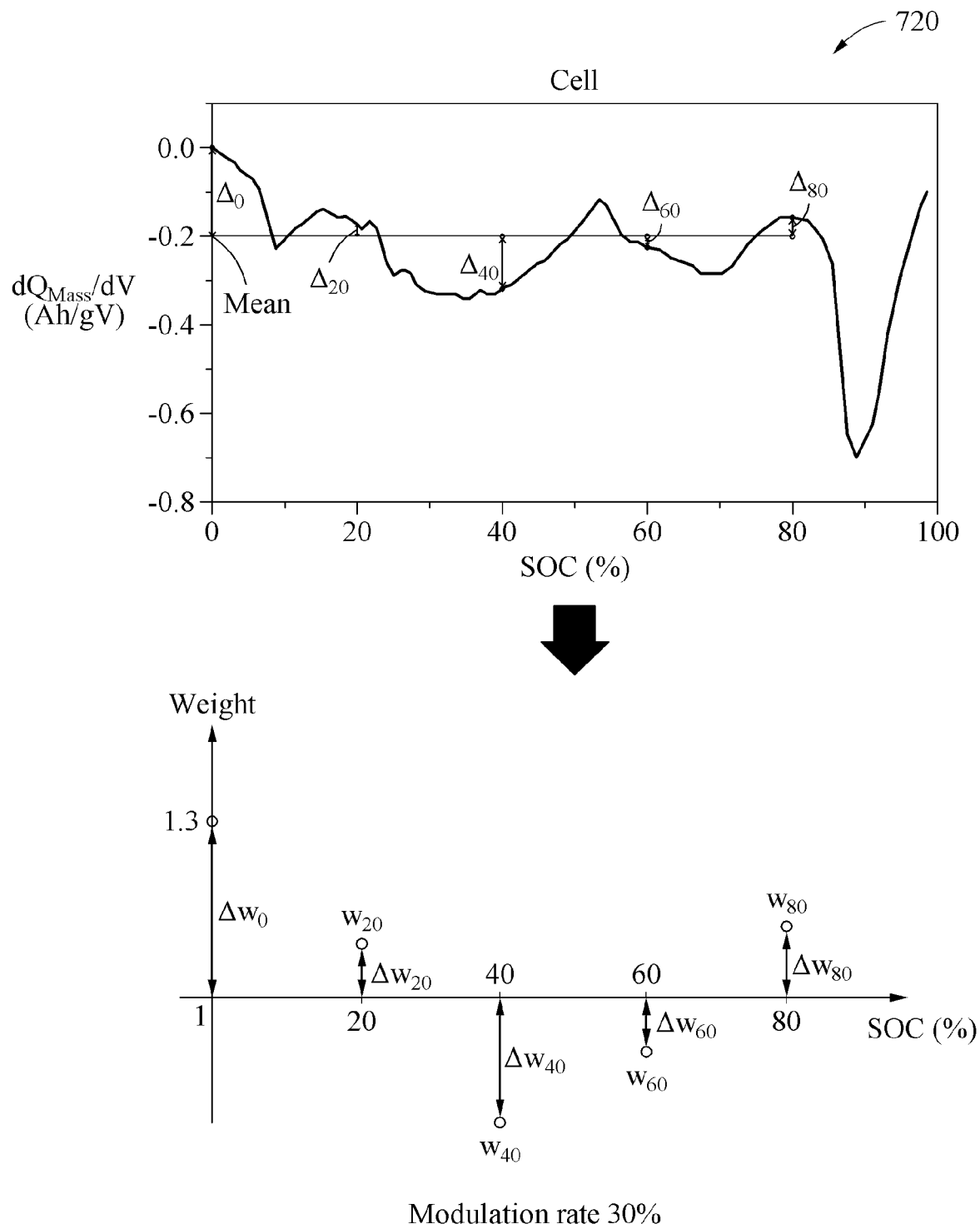
Figure 10B:
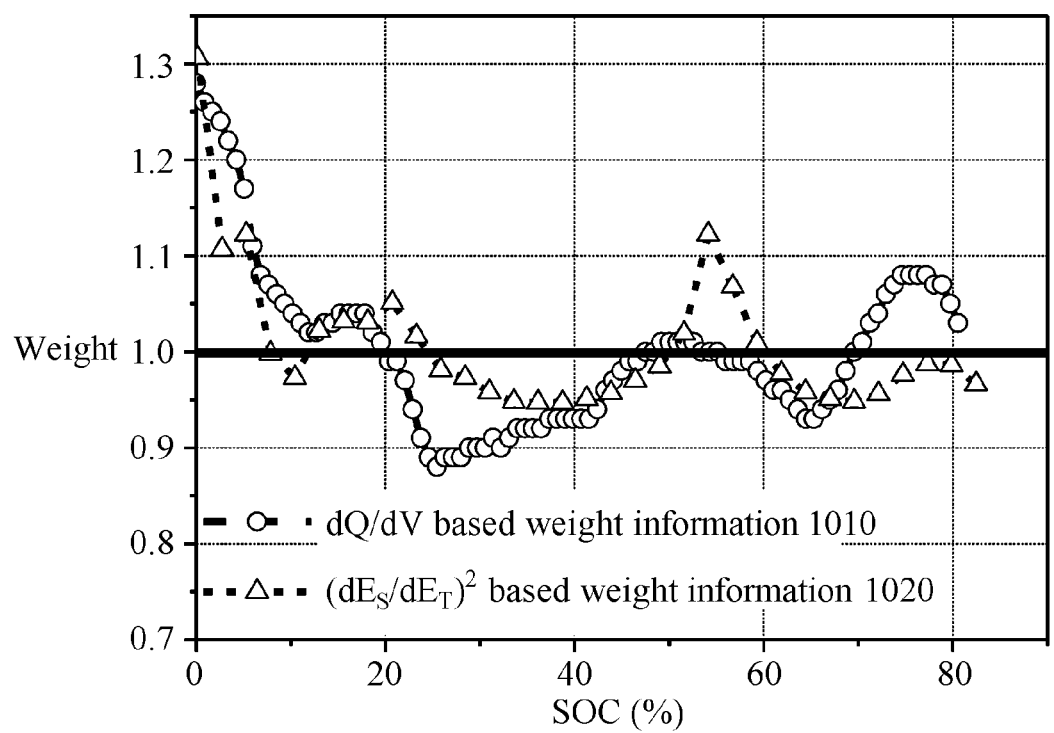

FIGS. 9 through 10B are diagrams illustrating an example of a weight deriver 420 of the battery charging profile generating apparatus 400.

Referring to FIG. 9, the weight deriver 420 derives weight information based on battery characteristic information determined by the characteristic estimator 410. In an example, the weight deriver 420 may derive the weight information using some characteristic values of the determined battery characteristic information, and a modulation rate. The modulation rate may be associated with a standard deviation of the derived weight information, and the characteristic values may be characteristic values in an SOC interval, for example, an interval from 0 to 80%. Hereinafter, operations of the weight deriver 420 will be described in detail with reference to FIG. 10A.

Referring to FIG. 10A, the weight deriver 420 calculates a mean value of characteristic values, in an SOC interval of 0 to 80%, of dQ/dV information 720, and a deviation of each of the characteristic values, and identifies a characteristic value having a maximum deviation among the calculated deviations. Referring to FIG. 10B, a deviation $\Delta_0$ of a characteristic value at an SOC of 0 may be a maximum value. In such a case, the weight deriver 420 may identify the characteristic value at the SOC of 0 to be the characteristic value having a maximum deviation.

The weight deriver 420 may define the calculated mean value as a weight of 1, and define a maximum weight based on the weight of 1 and a modulation rate. The modulation rate may be an element that determines a scale or a deviation of weight information. As illustrated in FIG. 10A, in a case in which a modulation rate is 30%, the weight deriver 420 may determine a maximum weight to be 1.3 by adding, to the weight of 1, 0.3 corresponding to 30% of the weight of 1.

The weight deriver 420 may map the identified characteristic value to the maximum weight of 1.3. Thus, a weight at an SOC of 0 may correspond to 1.3.

The weight deriver 420 may derive the weight information by increasing a deviation of each of the characteristic values in the SOC interval of 0 to 80% by a rate by which the deviation $\Delta_0$ of the identified characteristic value increases to a difference $\Delta\omega_0$ between the maximum weight and the weight of 1. As illustrated in FIG. 10A, when the rate by which $\Delta_0$ increases to $\Delta\omega_0$ is r, the weight deriver 420 may derive a weight $\omega_{20}$ at an SOC of 20 by increasing $\Delta_{20}$ by the rate r, and derive a weight $\omega_{40}$ at an SOC of 40 by increasing $\Delta_{40}$ by the rate r. That is, the weight deriver 420 may determine a value derived by increasing $\Delta_{20}$ by the rate r to be $\omega_{20}$, and determine a value derived by increasing $\Delta_{40}$ by the rate r to be $\omega_{40}$. The weight deriver 420 may also derive remaining weights by increasing each of remaining deviations by the rate r.

Similarly to what is described above with reference to FIG. 10A, the weight deriver 420 may derive the weight information based on characteristic values in an SOC interval of 0 to 80% of the $(dE_S/dE_T)^2$ information 820 and a modulation rate of 30%.

The method of deriving the weight information described above with reference to FIG. 10A is provided merely as an example, and the method of deriving the weight information is not limited to what is described above with reference to FIG. 10A. The weight deriver 420 may derive the weight information by applying a statistical analysis, for example, standardization, normalization, and the like, to the battery characteristic information.

FIG. 10B illustrates dQ/dV based weight information 1010 indicated by a symbol ○, and $(dE_S/dE_T)^2$ based weight information 1020 indicated by a symbol Δ. The dQ/dV based weight information 1010 may be weight information derived from the dQ/dV information 720 as described above with reference to FIG. 10A, and the $(dE_S/dE_T)^2$ based weight information 1020 may be weight information derived by applying the example described above with reference to FIG. 10A to the $(dE_S/dE_T)^2$ information 820.

As illustrated in FIG. 10B, a mean value of the dQ/dV based weight information 1010 may be 1 with a standard deviation of 8.5%, and a mean value of the $(dE_S/dE_T)^2$ based weight information 1020 may be 1 with a standard deviation of 8.8%. That is, the weight deriver 420 may derive the weight information from characteristic values in an SOC interval of 0 to 80% such that a mean value of the weight information is 1 with a standard deviation being a preset value.

In an example, the weight deriver 420 may derive at least one different set of weight information by adjusting a modulation rate. That is, the weight deriver 420 may derive a plurality of sets of weight information from the battery characteristic information such that standard deviations of the sets of weight information have different values in a preset range, for example, 0 to 30%. For example, the weight deriver 420 may derive a plurality sets of dQ/dV based weight information such that a standard deviation of each of the sets of dQ/dV based weight information is 4.3% and 12.8%, respectively. In this example, mean values of the sets of the weight information may be the same as 1. In addition, the weight deriver 420 may derive a plurality sets of $(dE_S/dE_T)^2$ based weight information such that a standard deviation of each of the sets of $(dE_S/dE_T)^2$ based weight information is 4.4% and 13.2%, respectively. In this example, mean values of the sets of the weight information may be the same as 1.

In an example, the weight deriver 420 may adjust the derived weight information by adding a value to the weight information. A higher current may be applied to the battery 120 based on a charging profile obtained by applying the weight information after being adjusted to a basic charging profile, than on a charging profile obtained by applying the weight information before being adjusted to the basic charging profile. Thus, a charging time may be reduced.

Figure 11:
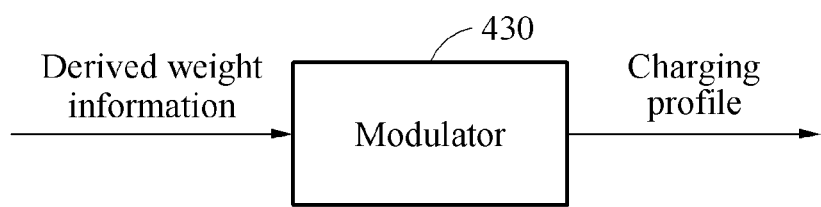
FIGS. 11 through 13 are diagrams illustrating an example of a modulator of a battery charging profile generating apparatus.
Figure 12:
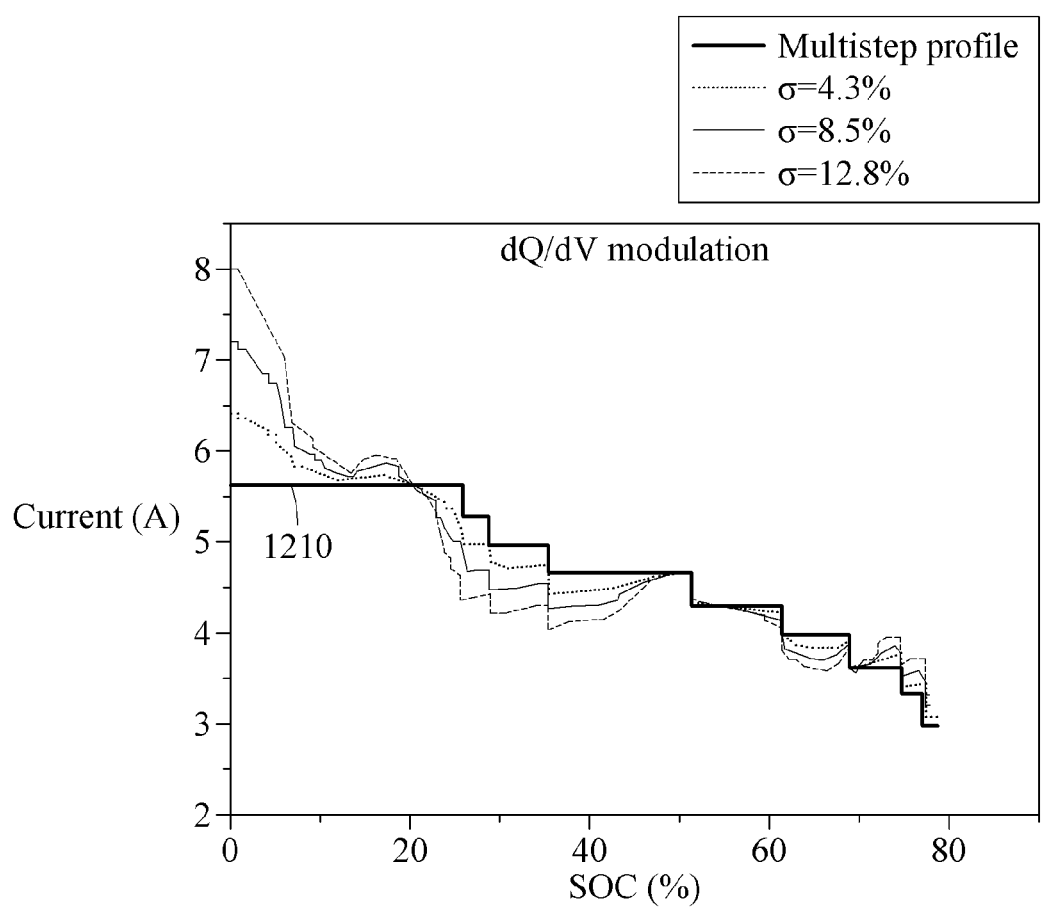
Figure 13:
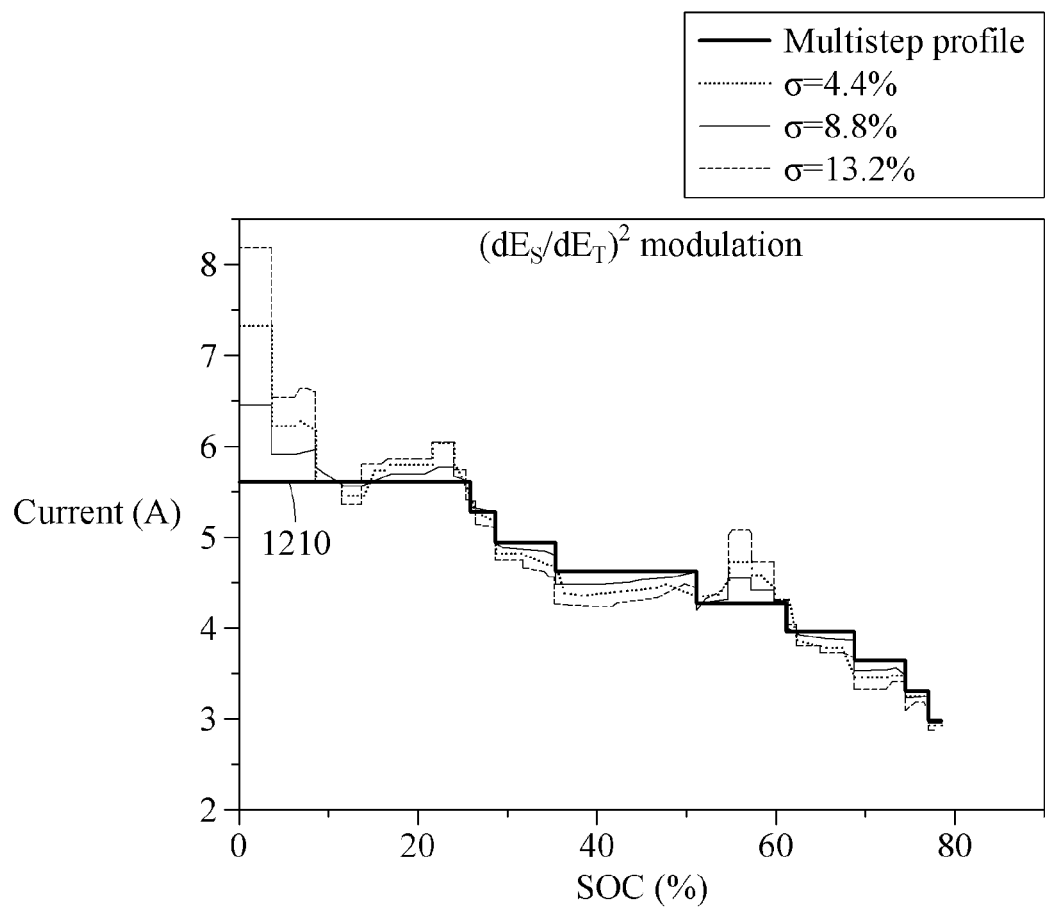

FIGS. 11 through 13 are diagrams illustrating an example of a modulator of a battery charging profile generating apparatus.

Referring to FIG. 11, the modulator 430 determines a charging profile based on weight information derived by the weight deriver 420 and a basic charging profile. For example, the modulator 430 may determine the charging profile by modulating the basic charging profile based on the derived weight information. That is, the modulator 430 may determine the charging profile by applying the derived weight information to the basic charging profile.

FIG. 12 illustrates example charging profiles and an example multistep basic charging profile 1210. The charging profiles illustrated in FIG. 12 correspond to results of multiplying the basic charging profile 1210 and dQ/dV based weight information for each of standard deviations, or modulation rates, for example, 4.3%, 8.5%, and 12.8%. In other words, the basic charging profile 1210 may be multiplied by the dQ/dV based weight information for each standard deviation or modulation rate. The dQ/dV based weight information for each of the standard deviations, or the modulation rates, may be applied to various basic charging profiles such as, for example, a CCVC based basic charging profile.

FIG. 13 illustrates other example charging profiles and an example multistep basic charging profile 1210. The charging profiles illustrated in FIG. 13 correspond to results of multiplying the basic charging profile 1210 and $(dE_S/dE_T)^2$ based weight information for each of standard deviations, or modulation rates, for example, 4.4%, 8.8%, and 13.2%. In other words, the basic charging profile 1210 may be multiplied by the $(dE_S/dE_T)^2$ based weight information for each standard deviation or modulation rate. The $(dE_S/dE_T)^2$ based weight information for each of standard deviations, or the modulation rates, may be applied to various basic charging profiles such as, for example, a CCCV basic charging profile.

At least one of the charging profiles illustrated in FIGS. 12 and 13 may be stored in the battery charging apparatus 110. The battery charging apparatus 110 may charge the battery 120 based on the charging profile stored in the battery charging apparatus 110.

Figure 14:
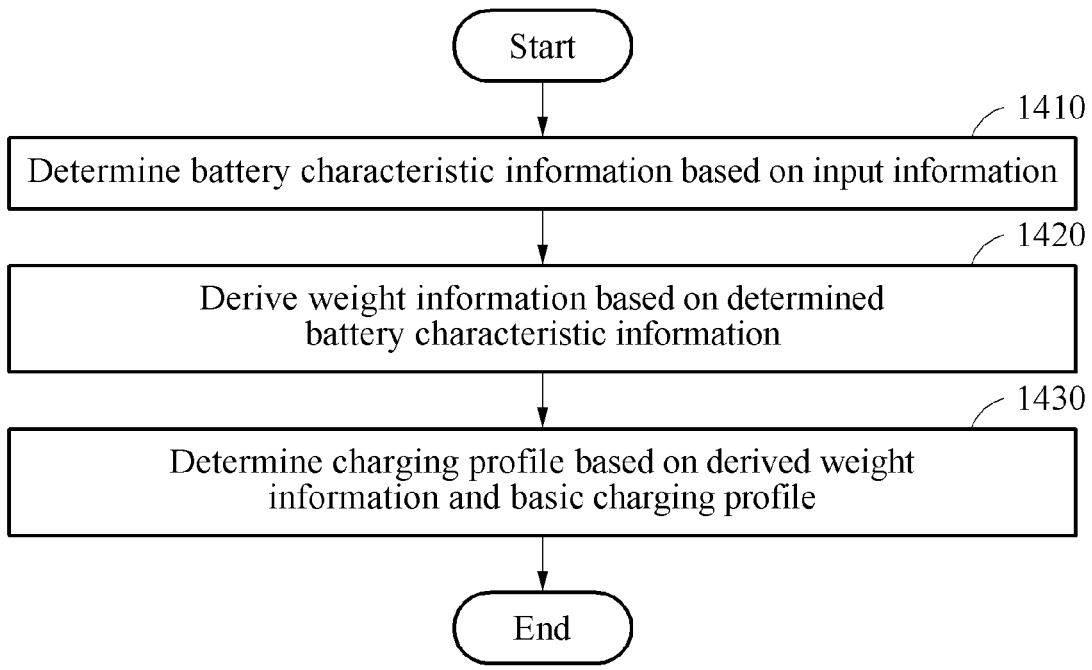
FIG. 14 is a flowchart illustrating an example of a battery charging method.

FIG. 14 is a flowchart illustrating an example of a battery charging method. The battery charging method illustrated in FIG. 14 may be performed by the battery charging profile generating apparatus 400 of FIG. 4.

Referring to FIG. 14, in operation 1410, the battery charging profile generating apparatus 400 determines battery characteristic information based on input information. For example, the input information may include charging information or discharging information of a battery cell. In this example, the battery charging profile generating apparatus 400 may determine dQ/dV based battery characteristic information, for example, the dQ/dV information 720 as illustrated in FIG. 10A, based on the charging information or the discharging information of the battery cell. For another example, the input information may include GITT measurement information for each SOC. In this example, the battery charging profile generating apparatus 400 may determine $(dE_S/dE_T)^2$ based battery characteristic information, for example, the $(dE_S/dE_T)^2$ information 820 as illustrated in FIG. 8B, based on the GITT measurement information for each SOC.

In operation 1420, the battery charging profile generating apparatus 400 derives weight information based on the determined battery characteristic information. For example, the battery charging profile generating apparatus 400 may derive dQ/dV based weight information 1010 as illustrated in FIG. 10B based on the dQ/dV based battery characteristic information. For another example, the battery charging profile generating apparatus 400 may derive $(dE_S/dE_T)^2$ based weight information 1020 as illustrated in FIG. 10B based on the $(dE_S/dE_T)^2$ based battery characteristic information.

In operation 1430, the battery charging profile generating apparatus 400 determines a charging profile based on the derived weight information and a basic charging profile.

According to an example, the battery charging method described above with reference to FIG. 14 may also be performed by the battery charging apparatus 110 of FIG. 1.

For more detailed description, reference may be made to the descriptions provided above with reference to FIGS. 1 through 13, which are applicable to the description provided with reference to FIG. 14.

Figure 15:
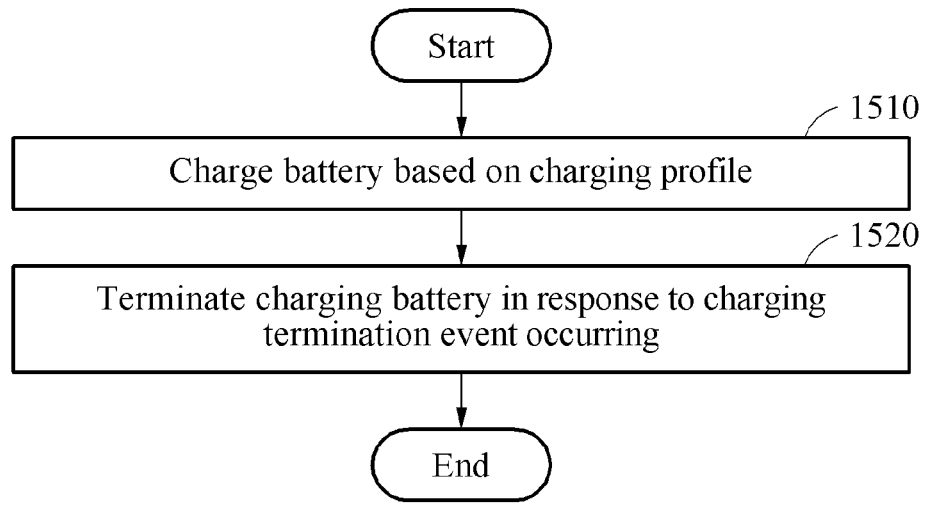
FIG. 15 is a flowchart illustrating another example of a battery charging method.

FIG. 15 is a flowchart illustrating another example of a battery charging method. The battery charging method illustrated in FIG. 15 may be performed by the battery charging apparatus 110 of FIG. 1.

Referring to FIG. 15, in operation 1510, the battery charging apparatus 110 charges the battery 120 of FIG. 1 based on a charging profile.

In operation 1520, the battery charging apparatus 110 terminates the charging of the battery 120 in response to a charging termination event occurring. For example, the charging termination event may occur when a voltage of the battery 120 reaches a threshold voltage while the battery 120 is being charged based on the charging profile. For another example, the charging termination event may occur when a current of the battery 120 reaches a termination current while the battery 120 is being charged with a constant voltage. In this example, when the voltage of the battery 120 reaches the threshold voltage, the battery 120 may be charged with the constant voltage.

In an example, the battery charging apparatus 110 may determine the charging profile by performing operations 1410 through 1430 described above with reference to FIG. 14 before performing operation 1510.

For more detailed description, reference may be made to the descriptions provided above with reference to FIGS. 1 through 14, which are applicable to the description provided with reference to FIG. 15.

Figure 16:
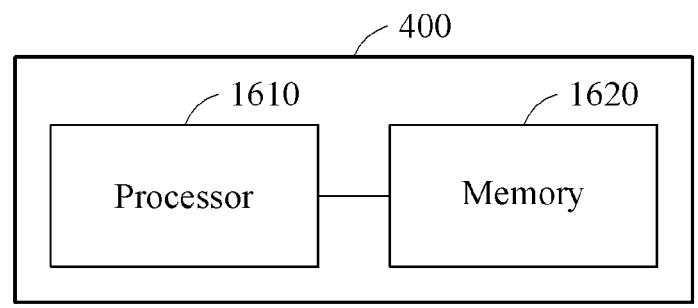
FIG. 16 is a diagram illustrating an example of a configuration of a battery charging profile generating apparatus.

FIG. 16 is a diagram illustrating an example of a configuration of a battery the charging profile generating apparatus 400.

Referring to FIG. 16, the battery charging profile generating apparatus 400 may include a processor 1610 and a memory 1620.

The processor 1610 may be embodied by the characteristic estimator 410, the weight deriver 420, and the modulator 430. The processor 1610 may determine battery characteristic information based on input information, derive weight information based on the determined battery characteristic information, and determine a charging profile based on the derived weight information and a basic charging profile.

The memory 1620 may store the determined charging profile.

For more detailed description, reference may be made to the descriptions provided above with reference to FIGS. 1 through 15, which are applicable to the description provided with reference to FIG. 16.

Figure 17:
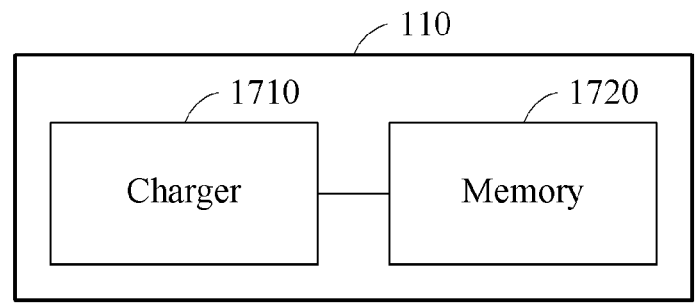
FIG. 17 is a diagram illustrating an example of a configuration of a battery charging apparatus.

FIG. 17 is a diagram illustrating an example of a configuration of the battery charging apparatus 110.

Referring to FIG. 17, the battery charging apparatus 110 may include a charger 1710 and a memory 1720.

The memory 1720 may store a charging profile.

The charger 1710 may include a controller, and operations of the charger 1710 may be implemented by the controller.

The charger 1710 may charge the battery 120 based on the charging profile, and terminate the charging of the battery 120 in response to a charging termination event occurring.

In an example, the battery charging apparatus 110 may include the battery charging profile generating apparatus 400. The battery charging profile generating apparatus 400 may determine the charging profile and allow the memory 1720 to store therein the determined charging profile.

For more detailed description, reference may be made to the descriptions provided above with reference to FIGS. 1 through 16, which are applicable to the description provided with reference to FIG. 17.

The battery charging apparatus 110 may be provided in various electronic apparatuses or devices including a battery, such as a walking assistant device, a vehicle, a terminal, and the like.

Figure 18:
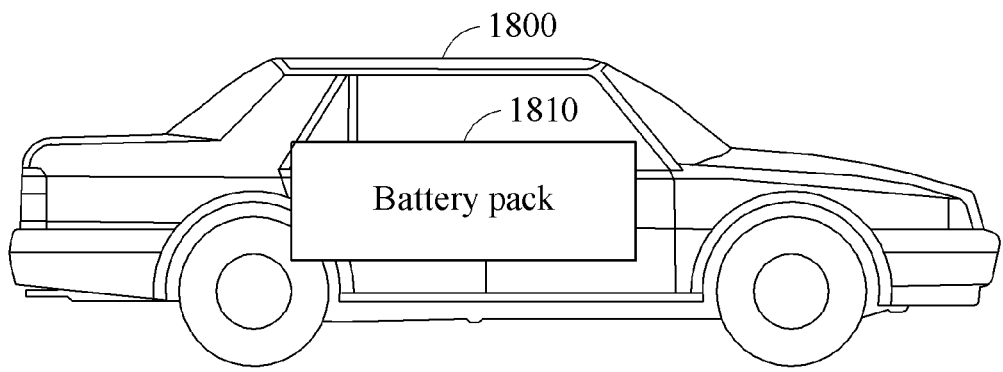
FIG. 18 is a diagram illustrating an example of a vehicle.

FIG. 18 is a diagram illustrating an example of a vehicle 1800.

Referring to FIG. 18, the vehicle 1800 includes a battery pack 1810. The vehicle 1800 may be a vehicle using the battery pack 1810 as a power source. For example, the vehicle 1800 may be an electric vehicle or a hybrid vehicle.

The battery pack 1810 includes a battery management system (BMS), and a plurality of battery cells or battery modules. The BMS may monitor the battery pack 1810 to verify whether an abnormality occurs in the battery pack 1810, and control the battery pack 1810 not to be overcharged or over-discharged. In addition, in a case in which a temperature of the battery pack 1810 is greater than a first temperature, for example, 40° C., or is less than a second temperature, for example, −10° C., the BMS may perform thermal control on the battery pack 1810. In addition, the BMS may perform cell balancing to equalize respective SOCs of the battery cells in the battery pack 1810.

In an example, the vehicle 1800 may include the battery charging apparatus 110. The battery charging apparatus 110 may charge the battery pack 1810, or the battery cells in the battery pack 1810, based on a charging profile. According to an example, the vehicle 1800 may include the battery charging profile generating apparatus 400. The battery charging profile generating apparatus 400 may determine a charging profile for the battery pack 1810, or a charging profile for each of the battery cells in the battery pack 1810.

For more detailed description, reference may be made to the descriptions provided above with reference to FIGS. 1 through 17, which are applicable to the description provided with reference to FIG. 18.

Figure 19:
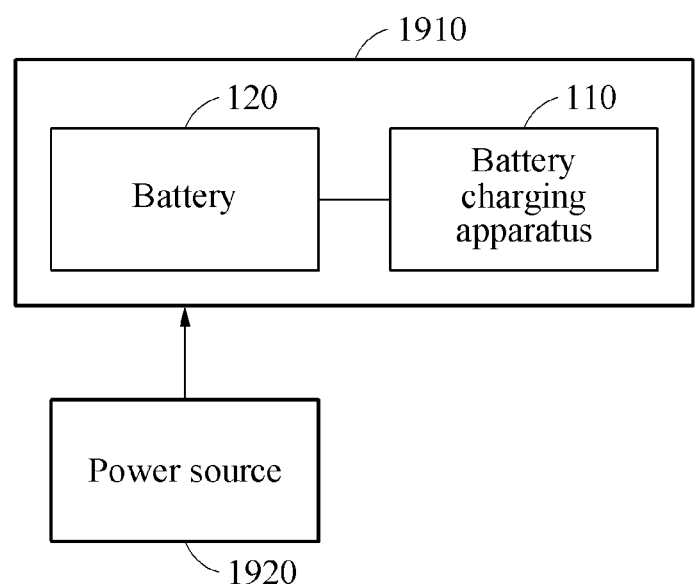
FIG. 19 is a diagram illustrating an example of a terminal.

FIG. 19 is a diagram illustrating an example of a terminal 1910.

Referring to FIG. 19, the terminal 1910 includes the battery charging apparatus 110 and the battery 120. The terminal 1910 may be, for example, a smartphone, a laptop, a tablet personal computer (PC), a mobile terminal such as a wearable device, or the like. However, the terminal 1910 is not limited to the foregoing examples.

The battery charging apparatus 110 may be provided in a form of an integrated circuit (IC), but not be limited thereto.

The battery charging apparatus 110 may receive power from a power source 1920 through a wire or wirelessly, and may charge the battery 120 using the power based on a charging profile. According to an example, the terminal 1910 may also include the battery charging profile generating apparatus 400. The battery charging profile generating apparatus 400 may determine the charging profile for the battery 120.

For more detailed description, reference may be made to the descriptions provided above with reference to FIGS. 1 through 18, which are applicable to the description provided with reference to FIG. 19.

The characteristic estimator 410, the weight deriver 420, the modulator 430, the processor 1610, the memory 1620, the charger 1710, and the memory 1720 illustrated in FIGS. 1, 4, 5, 9, 11, 16, and 17 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 14 and 15 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A battery charging method, comprising:
charging a battery based on a charging profile; and
in response to a charging termination event occurring, terminating the charging of the battery,
wherein the charging profile is determined using weight information derived based on battery characteristic information and a basic charging profile,
wherein the battery characteristic information corresponds to $(dE_S/dE_T)^2$ based on a state of charge (SOC) of the reference battery, and
wherein $dE_T$ is a change in voltage while a current is being applied, and $dE_S$ is a difference between an open-circuit voltage (OCV) before the current is applied and an OCV after the current is applied.

2. The battery charging method of claim 1, wherein the weight information is derived using $(dE_S/dE_T)^2$ values in an SOC interval of the $(dE_S/dE_T)^2$, and a modulation rate.

3. The battery charging method of claim 1, wherein the weight information is derived using characteristic values in a SOC interval of the battery characteristic information.

4. The battery charging method of claim 1, wherein the charging profile is modulated from the basic charging profile based on the weight information.

5. The battery charging method of claim 1, wherein the terminating of the charging of the battery comprises terminating the charging of the battery, in response to a voltage of the battery reaching a threshold voltage.

6. The battery charging method of claim 1, wherein the terminating of the charging of the battery comprises
charging the battery with a constant voltage, in response to a voltage of the battery reaching a threshold voltage, and
terminating the charging of the battery, in response to a current of the battery reaching a termination current while the battery is being charged with the constant voltage.

7. A non-transitory, computer-readable storage medium storing instructions that, when executed by a processor, cause the processor to perform the method of claim 1.

8. A battery charging method, comprising:
determining battery characteristic information of a battery based on input information;
deriving weight information based on the determined battery characteristic information; and
determining a charging profile based on the derived weight information and a basic charging profile,
wherein the determined charging profile is configured to be implemented to charge the battery,
wherein the determining of the battery characteristic information comprises determining state of charge-based (SOC-based) $(dE_S/dE_T)^2$ to be the battery characteristic information, and
wherein $dE_T$ is a change in voltage while a current is being applied, and $dE_S$ is a difference between an open-circuit voltage (OCV) before the current is applied and an OCV after the current is applied.

9. The battery charging method of claim 8, wherein the deriving of the weight information comprises deriving the weight information using $(dE_S/dE_T)^2$ values in an SOC interval of the SOC-based $(dE_S/dE_T)^2$, and a modulation rate.

10. The battery charging method of claim 8, wherein the deriving of the weight information comprises deriving the weight information using characteristic values in SOC interval of the battery characteristic information.

11. The battery charging method of claim 10, further comprising:
deriving different weight information by adjusting a modulation rate.

12. The battery charging method of claim 8, wherein the determining of the charging profile comprises modulating the basic charging profile based on the derived weight information.

13. The battery charging method of claim 8, further comprising:
charging the battery based on the determined charging profile.

14. A battery charging apparatus, comprising:
a memory configured to store a charging profile; and
a charger configured to charge a battery based on the charging profile, and terminate the charging of the battery in response to a charging termination event occurring,
wherein the charging profile is determined using weight information, derived based on battery characteristic information, and a basic charging profile,
wherein the battery characteristic information corresponds to $(dE_S/dE_T)^2$ based on a state of charge (SOC) of a reference battery, and
wherein $dE_T$ is a change in voltage while a current is being applied, and $dE_S$ is a difference between an open-circuit voltage (OCV) before the current is applied and an OCV after the current is applied.

15. The battery charging apparatus of claim 14, wherein the basic charging profile is a charging profile in which a charging current changes stepwise based on a state of charge (SOC) of a reference battery.

16. The battery charging apparatus of claim 14, wherein the basic charging profile is a constant current-constant voltage (CCCV) based charging profile.

17. The battery charging apparatus of claim 14, wherein the charging profile is determined by applying the weight information to the basic charging profile.

18. The battery charging apparatus of claim 14, wherein the weight information comprises weight information for each of modulation rates, and wherein the charging profile is determined by multiplying the basic charging profile and the weight information for each of the modulation rates.

* * * * *